(12) United States Patent
Englund et al.

(10) Patent No.: US 11,500,186 B2
(45) Date of Patent: Nov. 15, 2022

(54) COMBINED MICROSCOPE OBJECTIVE AND MICROWAVE WIRE FOR OPTICALLY DETECTED MAGNETIC RESONANCE IMAGING

(71) Applicant: Massachusetts Institute of Technology, Cambridge, MA (US)

(72) Inventors: Dirk R. Englund, Brookline, MA (US); Hyeongrak Choi, Cambridge, MA (US); Michael P. Walsh, Somerville, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 385 days.

(21) Appl. No.: 16/670,280

(22) Filed: Oct. 31, 2019

(65) Prior Publication Data

US 2020/0201012 A1 Jun. 25, 2020

Related U.S. Application Data

(60) Provisional application No. 62/782,744, filed on Dec. 20, 2018.

(51) Int. Cl.
*G01B 21/02* (2006.01)
*G02B 21/02* (2006.01)
*G01R 33/26* (2006.01)

(52) U.S. Cl.
CPC ............ *G02B 21/02* (2013.01); *G01R 33/26* (2013.01)

(58) Field of Classification Search
CPC ........ G02B 21/00; G02B 21/02; G02B 21/06; G02B 5/28; G01R 33/26; G01R 33/323; G03F 7/0275; G03F 7/70275; G03F 7/70308; G03F 7/70325; G01Q 60/22
See application file for complete search history.

(56) References Cited

U.S. PATENT DOCUMENTS

| | | | |
|---|---|---|---|
| 6,809,860 B2 * | 10/2004 | Stenzel | G02B 21/248 359/368 |
| 7,102,817 B1 | 9/2006 | Wu | |
| 7,623,746 B2 | 11/2009 | Naughton et al. | |
| 8,560,051 B2 | 10/2013 | Piron et al. | |
| 2017/0010338 A1 * | 1/2017 | Bayat | G01R 33/323 |

FOREIGN PATENT DOCUMENTS

WO WO-2007090331 A1 * 8/2007 ............ G02B 7/04

OTHER PUBLICATIONS

PCT International Preliminary Report on Patentability dated Jul. 1, 2021 for International Application No. PCT/US2019/067377; 9 Pages.

International Search Report and Written Opinion of the ISA dated Mar. 5, 2020 for International Application No. PCT/US2019/067377; 15 Pages.

* cited by examiner

*Primary Examiner* — Mustak Choudhury
(74) *Attorney, Agent, or Firm* — Daly, Crowley, Mofford & Durkee, LLP

(57) ABSTRACT

A microscope objective is disclosed comprising; a lens; a housing; a lens holder that is arranged to couple the lens to the housing; a first conductor and a second conductor, the first conductor and the second conductor extending along a sidewall of the housing, the first conductor and the second conductor being arranged to form at least one loop that is that is disposed about at least a portion of a perimeter of a field of view of the lens.

18 Claims, 9 Drawing Sheets

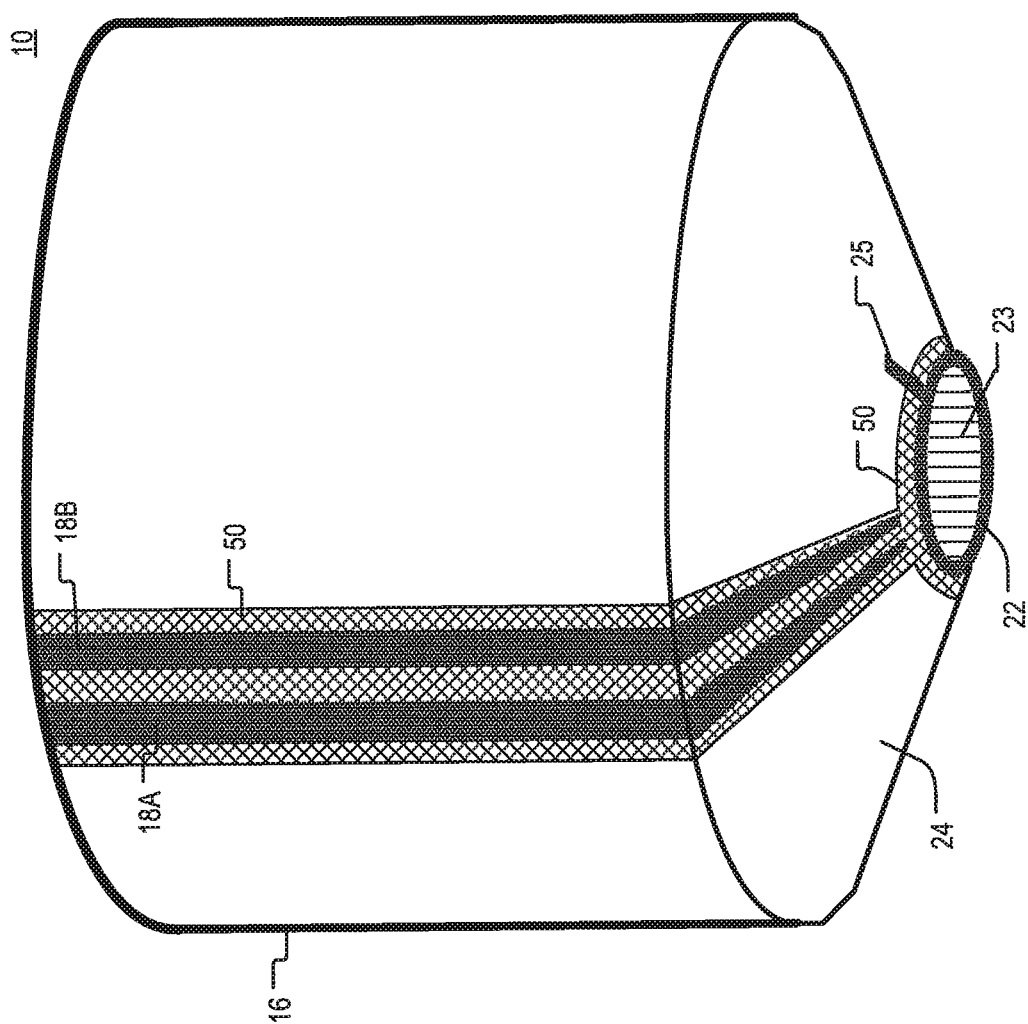

COMBINED MICROSCOPE OBJECTIVE AND MICROWAVE WIRE FOR OPTICALLY DETECTED MAGNETIC RESONANCE IMAGING

CROSS REFERENCE TO RELATED APPLICATION

This application claims the benefit of U.S. Provisional Application No. 62/782,744 filed Dec. 20, 2018, under 35 U.S.C. §119(e) which application is hereby incorporated herein by reference in its entirety.

STATEMENT REGARDING FEDERALLY SPONSORED RESEARCH

This invention was made with government support under EFMA1641064 and DMR1231319 awarded by the National Science Foundation (NSF). The government has certain rights in the invention

BACKGROUND

As is known in the art, there exist applications which require magnetic fields to be applied to a sample being imaged in a microscope. One such application, for example, is optically detected magnetic resonance (ODMR). ODMR involves optical "excitation" of a sample together with the application of an electromagnetic field (e.g. application of a signal having a frequency in the radio frequency (RF) range including the microwave frequency range). Pulse sequences, including ODMR may be used, for example, to control nitrogen vacancy (NV) centers in diamond.

As is also known, in this particular application, a magnetic field is applied using a wire strung across the sample and positioned near the imaging field of the microscope. For the NV application, an RF signal having a frequency of about 3 GHz may be used. For other samples addressed by ODMR, electro-magnetic fields that should be applied can be anywhere from DC to tens or even hundreds of GHz. To obtain a strong enough magnetic field (on the order of a Gauss) near the sample center—e.g., on the NV center—it is typically necessary to arrange a thin wire (e.g. a wire having a diameter in the range of about 50 micron (μm) to about 200 μm) close to the microscope center.

There are, however, several problems with the current systems and techniques. For example, each time a new spot is addressed, the microscope focal spot is moved and it is generally necessary to re-position the wire. This process is tedious and slow. Also, the magnetic field in the sample plane, produced by a wire near a conductive housing and associated conductive structure used to hold an objective, can be significantly reduced because an alternating current induces a current (a so-called "image current") in the objective (conductor), which in turn may cancel, at least in-part, the induced magnetic flux. The housing (and in particular a bottom portion of nearly all microscope objectives) includes an electrically conductive holder.

SUMMARY

According to aspects of the disclosure, a microscope objective is disclosed comprising: a lens; a housing; a lens holder that is arranged to couple the lens to the housing; a first conductor and a second conductor, the first conductor and the second conductor extending along a sidewall of the housing, the first conductor and the second conductor being arranged to form at least one loop that is disposed about at least a portion of a perimeter of a field of view of the lens.

According to aspects of the disclosure, a microscope objective is disclosed having an optical path, the microscope objective comprising: a housing having a radio-frequency (RF) connector disposed thereon; a lens holder that is coupled to the housing; a first conductor and a second conductor that are electrically coupled to the RF connector, the first conductor and the second conductor extending along a sidewall of the housing and onto the lens holder, the first conductor and the second conductor being arranged to form at least one loop onto a surface of the lens holder, the at least one loop being disposed on the optical path of the housing.

According to aspects of the disclosure, a microscope objective is disclosed having an optical path, the microscope objective comprising: a housing; a lens holder that is coupled to the housing, the lens holder having a main surface extending across the optical path, the main surface having one or more notches formed thereon; a first conductor and a second conductor that are coupled to a sidewall of the housing, the first conductor and the second conductor being arranged to form a loop.

BRIEF DESCRIPTION OF THE DRAWINGS

The foregoing features may be more fully understood from the following description of the drawings in which:

FIG. 5 is a perspective view of a microscope objective, according to aspects of the disclosure; is a side view of a microscope objective, according to aspects of the disclosure;

DETAILED DESCRIPTION

Figure 1A:
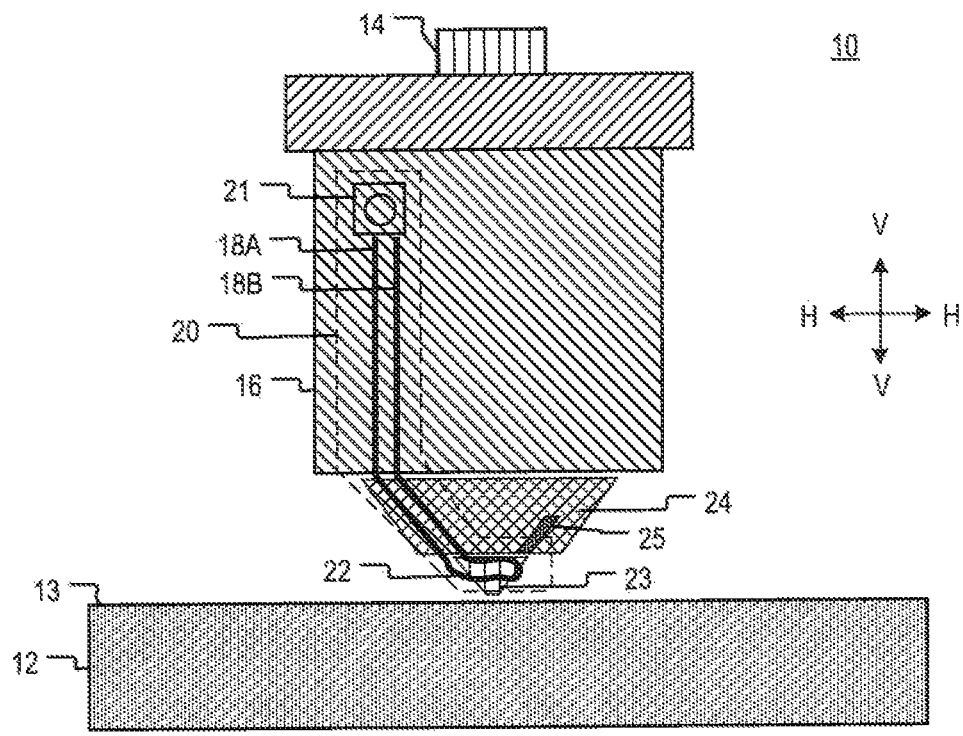
FIG. 1A is a side view of a microscope objective, according to aspects of the disclosure.

In accordance with the concepts, systems, structures and techniques described herein, a microscope objective comprises a lens and a "built-in" magnetic field delivery system. The microscope objective may also include a means for reducing (and ideally eliminating) a so-called image current which may be generated by the magnetic field delivery system.

With such an arrangement, a microscope objective capable of generating a magnetic field in a plane of a sample is provided. Furthermore, since the magnetic field delivery system is provided as part of the microscope objective (i.e. is "built-into" the microscope objective), the wire moves with the objective. Thus, the wire needed to apply magnetic fields is always in the center of view, even as the sample is moved around or samples are switched. This also provides a repeatable and thus, known field amplitude at the focus of the microscope. Thus, it is not necessary to re-position a wire on a sample for the purpose of imaging different portions of a sample.

In embodiments, the microscope objective magnetic field delivery system comprises a pair of conductors having a first end configured to accept an RF signal and a second end configured to be disposed on or proximate to a surface of a lens of a microscope objective. In embodiments, the lens is configured to be closest to a sample to be viewed.

In embodiments, a first one of the pair of conductors corresponds to a signal wire and a second one of the pair of conductors corresponds to a ground wire. First ends of the pair of conductors are configured to accept an RF signal (e.g. through an RF connector coupled thereto, for example). Second ends of the pair of conductors are configured to form a loop. In some embodiments, the wire loop is disposed on (i.e. physically touching) the surface of the lens. In some embodiments, the wire loop is disposed over (i.e. not physically touching) the surface of the lens.

In embodiments, a microscope objective comprises a lens holder which secures the lens to other portions of the objective. In embodiments, the lens holder has one or more notches (or channels) provided therein. The notches operate to inhibit a current from flowing on lens holder.

In embodiments, the wire/notch is provided on a lens which is not the very front lens of the microscope objective.

The arrangement of a microscope objective/microwave wire combination has at least two advantages: first, the wire needed to apply magnetic fields is always in the center of view, even as the sample is moved around or samples are switched; and second, by including a notch or channel in the lens holder, the magnetic field is not partially canceled by an image current in the objective. This also provides a repeatable and thus, known field amplitude at the focus of the microscope.

It should, of course, be appreciated that besides loops to apply magnetic fields, the bottom of the microwave objective can contain other types of probes, including, but not limited to: high-frequency, impedance matched, electrical probes to make electrical contact to the sample; capacitive probes to measure capacitance locally; any form of scanning probes, such as atomic force microscopy; optically detected magnetic resonance at room temperature, high temperature, or low temperature (in a cryostat); and/or any form of microscopy that benefits from applying microwave fields to a sample, such as imaging of magnetic materials (Kerr and Faraday rotation microscopy).

By employing high-frequency, impedance matched, electrical probes to make electrical contact to the sample, the microscope could function as an electrical probe station having electrical probes directly attached to the objective. This would enable probing of very small devices with small contact pads, together with high-collection-efficiency and high-resolution microscopy capacitive probes to measure capacitance locally By employing scanning probes, in the case of AFM, the AFM cantilever could be measured through a confocal microscope, obviating the need for external optics that are commonly used in AFM systems.

Referring now to FIG. 1A, a microscope objective 10 is arranged over a sample holder 12 on which a sample to be viewed (not shown) may be placed. The microscope objective 10 may include an optical input/output 14 coupled to a first end of an optical path. The optical path may include a series of lens (not shown), and it may extend through the housing 16. The other end of the optical path may be coupled to a lens holder 24. The lens holder 24 may be provided having an opening (e.g., a cylindrical-shaped opening, etc.) in a center portion thereof to avoid obstructing the optical path of the microscope objective 10. The lens holder 24 may be arranged to hold a lens 23 of the microscope objective 10, which is arranged to terminate the optical path.

The lens holder 24 may have any suitable shape. For example, in some implementations, the lens holder 24 is may have a conical shape which allows collection (e.g., a relatively large collection, etc.) of emission/reflection from a sample (e.g., large numerical aperture, etc.). The lens holder 24 may be formed of any suitable type of conductive or non-conductive material. For example, in some implementations, the lens holder 24 may be formed of a non-conductive material, a ceramic material, a PTFE derivative material, a polymer material, glass, etc. The particular material from which the lens holder 24 is formed may be selected to suit the needs of the particular application. Factors to consider in selecting a material include the power level being used, etc.

The lens holder 24 may be provided with a magnetic field delivery system 20, as shown. The magnetic field delivery system 20 may include a conductor 18 (e.g., a wire) that is formed of conductors 18a and 18b. Conductors 18a and 18b may be arranged to form a loop 22 for generating a magnetic field. The loop 22 may be disposed around a lens 23, as shown. Conductor 18a may be a signal wire and conductor 18b may be a ground wire of the loop 22. For reasons which will become apparent form. the description herein below, first ends of conductors 18a, 18b are coupled to an RF input/output port 21, and second ends of conductors 18a, 18b are coupled together to form the loop 22. The RF/input/output port 21 may be attached or otherwise coupled to the housing 16. The RF input/output port 21 may be electrically coupled to the conductors 18a and 18b, and it may include any suitable type of connector, such as an SMA coaxial connector or an SMP coaxial connector for example. In implementations in which the housing 16 formed of metal, the conductors 18a and 18b may be impedance matched to a characteristic impedance such as 50 Ohms on the housing 16.

In some implementations, a tradeoff may be made between the characteristic impedance established by the signal and conductors 18a, 18b, and the amount of heat generated by signals propagating through the conductors 18a, 18b. For example, it may be desirable to provide the characteristic impedance of the conductors 18a and 18b to reduce the heat (or to maintain the heat within a desired range for a particular application). In some implementations, an impedance mismatch may exist between the characteristic impedance of the conductors 18a and 18b and the characteristic impedance of the port 21 (and RF signal source coupled thereto). In this case, it may be desirable or even necessary to include an impedance matching circuit (also sometimes referred to as an impedance matching network) between the port 21 and the conductors 18a and 18b.

In some implementations, the loop 22 may be suspended or otherwise disposed beneath the microscope objective 10 (and thus not touching the lens 23) so that the loop 22 intentionally comes into contact (or nearly into contact) with a sample, as the microscope objective 10 is lowered onto the sample. Additionally or alternatively, in some implementations, the loop 22 may be held underneath the microscope objective 10 (i.e., against or proximate to a surface of the lens 23). The loop 22 may be provided having any desired shape (e.g., circular, oval, rectangular, square, triangular or any other geometrically regular or irregular shape). In some implementations, the plane of the loop 22 can be in-plane with the top surface 13 of the sample holder 12 (e.g., parallel to the sample plane). Additionally or alternatively, in some implementations, the loop 22 can be out-of-plane with the top surface of the sample holder 12. The in-plane geometry would produce a perpendicular magnetic field at the center of the field of view of the lens 23, whereas the out-of-plane loop geometry would produce a strong in-plane magnetic field component.

In some implementations, the lens holder 24 may be formed of a conductive material and could have a notch 25 (or channel) cut or otherwise provided therein. The notch 25 may produce an open circuit in the portion of the lens holder 24 where the notch 25 is formed, thereby preventing the induction of a cancelling current in the lens holder. Notably, the notch 25 reduces and ideally prevents a current flow from creating a magnetic field which affects (e.g., reduces or cancels some or all of) the magnetic field created by the current flowing through the conductors 18a and 18b. The length of the notch 25 is preferably selected to be larger than the range of the magnetic field such that the magnetic field is not inducing a current on the holder. The notch 25 is thus provided having dimensions (e.g., length, width, depth) selected to disrupt the field. Functionally, the notch 25 prevents some or, ideally all, current from flowing and converts the current to a voltage (i.e., the notch 25 operates such that the field is considered as a DC field). The length of the notch 25 is, at least in part, determined by the geometry of the loop 22. Although in the example of FIG. 1A, the notch 25 is formed in the lens holder 24, it will be understood that alternative implementations are possible in which at least a portion of the notch is formed in the housing 16.

The notch 25 may have any suitable cross-sectional shape. For example, in some implementations, the notch 25 may be provided having a rectangular or square cross-sectional shape while in other implementations, the notch may be provided having an oval or circular cross-sectional shape. The notch 25 may also be provided having other cross-sectional shapes including, but not limited to triangular or star cross-sectional shapes. In some implementations, it may be desirable to utilize multiple notches 25. The number of notches 25 to use in a particular application is selected in accordance with a variety of factors including, but not limited to, the frequency of operation and the power levels of the signals involved. Although the dimensions of the notch 25 are substantially frequency independent, at increasingly high frequencies, it may be desirable, or even necessary, to increase the size of the notch 25.

The shape and/or dimensions of the notch 25 may depend on the particular application in which the microscope objective 10 is desired to be used. For example, in applications having an operating frequency of about 3 GHz (so a wavelength ($\lambda$) equal to about 10 cm) a single notch may be used, it should be appreciated that the frequency of the signal does not dictate the notch size. The extent of the field will depend more on the geometry of the loop. It is recognized that the length and width of the notch will change the impedance.

The circumference of the microscope objective 10 is related to its operating wavelength. In this regard, the microscope objective 10 may need multiple notches as frequency increases (and thus wavelength decreases). It should be noted that a single notch is appropriate in applications in which the circumference of the loop will be much less than 10 cm. In embodiments in which multiple notches need to be present on the microscope objective 10, the notches may be disposed symmetrically around the microscope objective 10, but in some applications an asymmetric arrangement of notches may be used.

Figure 1B:
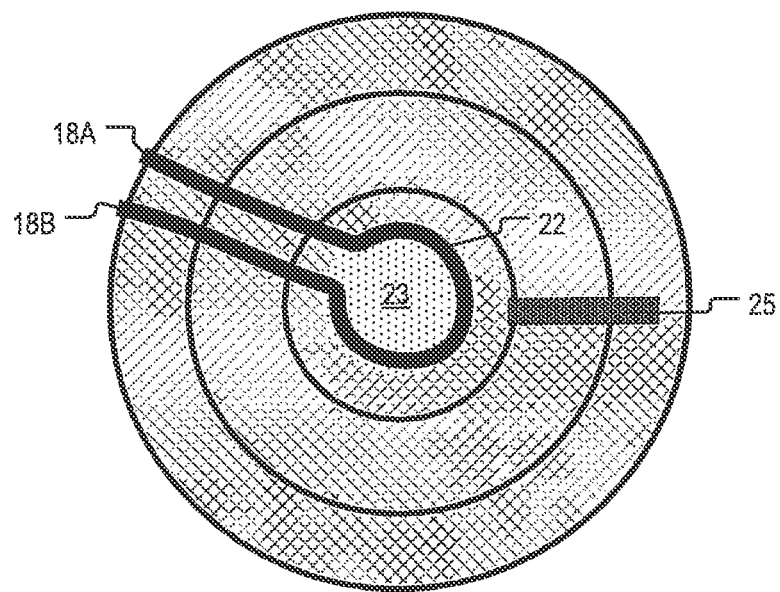
FIG. 1B is a bottom view of a microscope objective, according to aspects of the disclosure.

FIG. 1B shows a planar view of the lens holder 24 in further detail. As illustrated, in some implementations, the conductors 18a and 18b may be arranged to form only one loop 22, which is disposed within the field of view of the lens 23. In the example of FIG. 1, the lens holder is formed of a metal material and is conductive as a result. The notch 25 is provided in the lens holder 24. As illustrated, the notch 25 (or channel) is cut partway into the lens holder 24 and extends through the entire thickness of the lens holder 24.

Figure 1C:
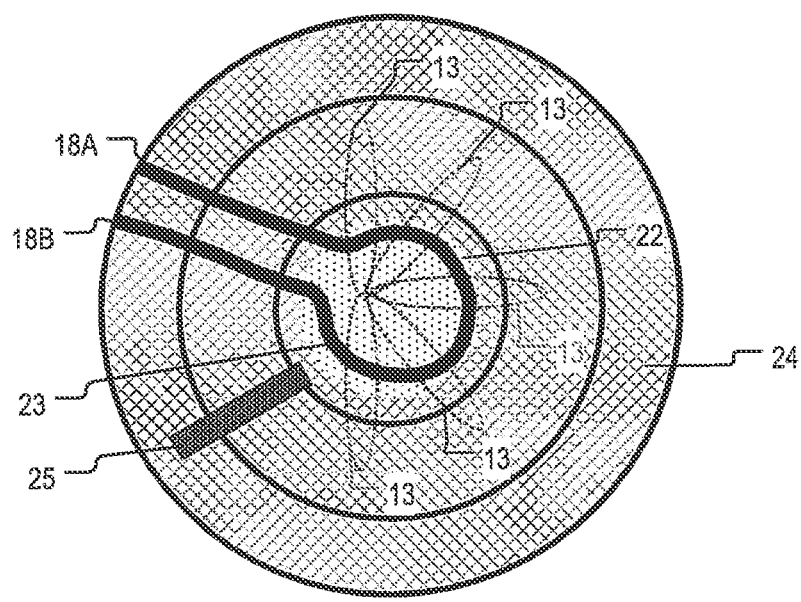
FIG. 1C is a bottom view of a microscope objective, according to aspects of the disclosure.

FIG. 1C a planar view of the lens holder 24 in accordance with another implementation. In the example of FIG. 1C, the loop 22 is formed around a circumference of the lens 23. The loop 22 is arranged to produce an in-plane magnetic field (e.g., a magnetic field that is more pronounced along axis H-H, which is shown in FIG. 1A). The shape of the in-plane magnetic field is also visualized by the magnetic field lines 13, which are shown in FIG. 1C.

Figure 1D:
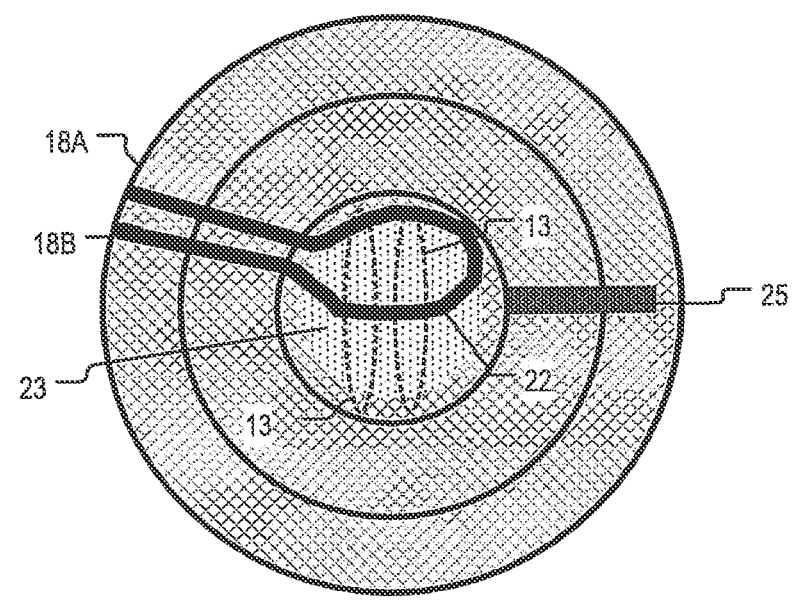
FIG. 1D is a bottom view of a microscope objective, according to aspects of the disclosure.

FIG. 1D is a planar view of the lens holder 24, in accordance with another implementation. In the example of FIG. 1D, at least a portion of the loop 22 is disposed above or below a mid-portion of the lens 23. The loop 22 is arranged to produce a vertical magnetic field (e.g., a magnetic field that is more pronounced along axis V-V, which is shown in FIG. 1). The shape of the vertical magnetic field is also visualized by the magnetic field lines 13, which are shown in FIG. 1D. According to the present disclosure, the terms "loop" and "loop turn" may be used interchangeably when context permits.

It should be appreciated that other structures/shapes besides loops may also be used to apply magnetic fields. For example, a bottom of a microscope objective 10 can contain other types of probes, including, but not limited to: high-frequency, impedance matched, electrical probes to make electrical contact with the sample; capacitive probes to measure capacitance locally; any form of scanning probes (including but not limited to atomic force microscopy (AFM)); optically detected magnetic resonance at room temperature, high temperature, or low temperature (in a cryostat); and/or any form of microscopy that benefits from applying microwave fields to a sample, such as imaging of magnetic materials (Kerr and Faraday rotation microscopy).

Figure 2A:
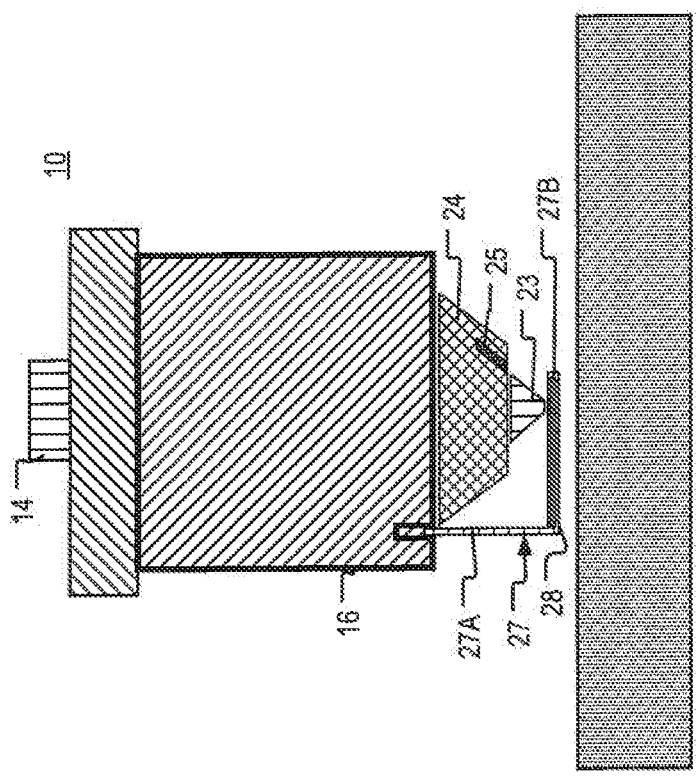
FIG. 2A is a side view of a microscope objective, according to aspects of the disclosure.
Figure 2B:
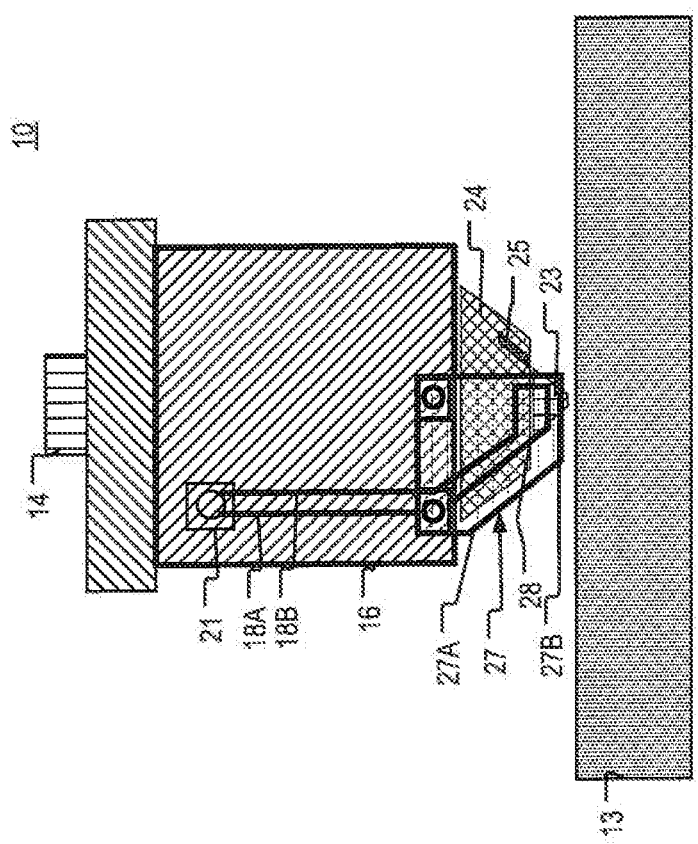
FIG. 2B is another side view of a microscope objective, according to aspects of the disclosure.

FIGS. 2A-B shows the microscope objective 10, in accordance with another implementation. Specifically, FIG. 2A is a planar side view of the microscope objective 10 when viewed from a first direction, and FIG. 2B is a planar side view of the microscope objective 10 when viewed from a second direction that is offset from the first direction by 90 degrees. In the example of FIGS. 2A-B, the microscope objective 10 is provided with a clip 27 having a portion 27A and a portion 27B. Portion 27A may be situated to the side of the lens holder 24, and portion 27B may be situated directly under the lens holder 24. The clip 27 may be an interchangeable probe attachment having a loop 28, which is arranged to electrically connect to conductors 18*a* and 18*b* when the clip 27 is mounted on the microscope objective 10. The loop 28 may be the same or similar to the loop 22, which is discussed above with respect to FIGS. 1A-D. The loop 28 may be formed in portion 27B of the clip 27, as shown. As can be readily appreciated, the clip 27 allows different loops to be coupled to the microscope objective 10. In this way, it is possible to utilize loops having different characteristics and/or different configurations with the same microscope objective. According to aspects of the disclosure, the clip 27 may be used in the event that the loop 28 must be replaced (e.g., due to wire damage or the desire to use wire having a different or particular geometry, etc.). Although in the example of FIG. 2 the clip 27 is provided with a loop, alternative implementations are possible in Which the clip 27 is provided with another type of probe for forming a magnetic field. The clip 27 may be coupled to the housing using any number of attachment techniques. For example, the clip may be coupled to the housing 16 by using fasteners or a flexible bracket that is coupled to the clip 27 and arranged to snap around the housing 16 to hold the clip 27 firmly in place.

In some embodiments, the microscope objective 10 may be designed to have a very short working distance so that the bottom of the loop 28 is relatively close to the sample (e.g., within about of the sample). It should be noted that a typical small working distance Objective has a working distance of ~200 um, while one needs ~40 um for the loop-sample distance. By using a clip 27, which brings loop 28 closer to the sample, one can get a higher magnetic field (at RF frequency). In embodiments, the conductive portions of the microscope objective 10 (e.g., the housing 16) may act as a ground plane to the signal conductors included with the clip 27.

Figure 3B:
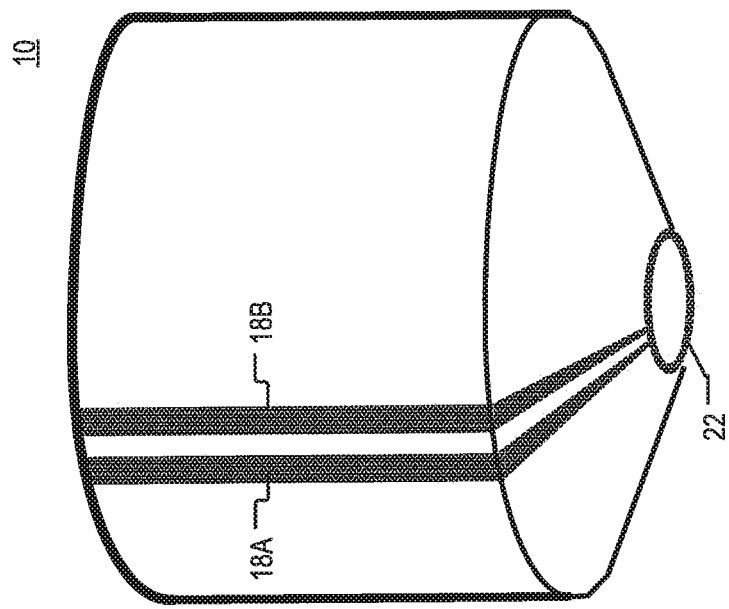
FIG. 3B is a perspective view of the microscope objective of FIG. 3A, according to aspects of the disclosure.
Figure 3A:
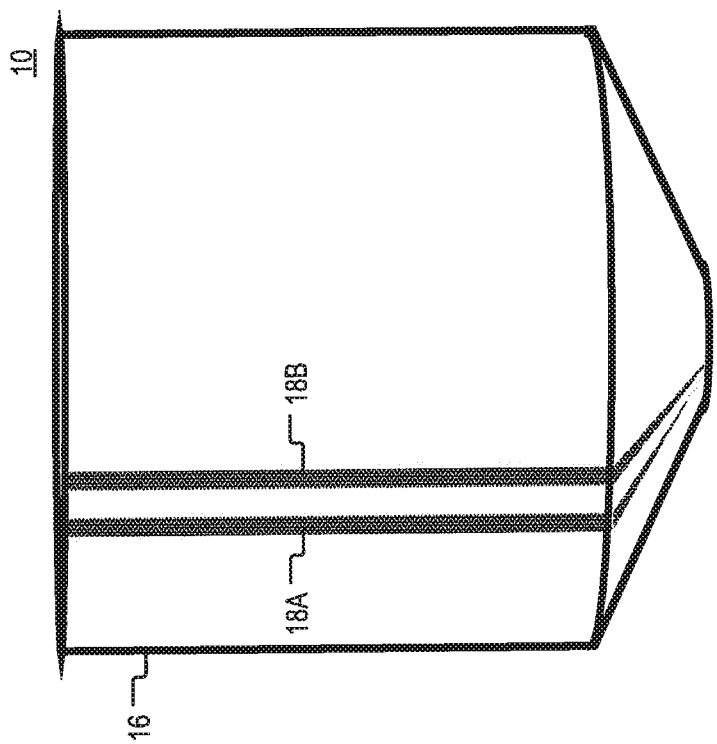
FIG. 3A is a side view of a microscope objective, according to aspects of the disclosure.

FIGS. 3A-B show the microscope objective 10, in accordance with yet another implementation. In the example of FIGS. 3A-B, each of the conductors 18*a* and 18*b* is implemented by using a microstrip transmission line and the housing 16 is formed of a non-conductive material. The microstrip transmission line tapers to a loop at the base of the microscope objective 10 to achieve a desired impedance. The impedance of the microstrip transmission line may be selected in a well-known fashion to deliver microwave power to the loop 22. Although the implementation of FIGS. 3A-B uses a microstrip transmission line, it will be understood that any type of transmission line may be used, including, but not limited to, a stripline, a microstrip, a co-planar waveguide transmission line, etc.

Figure 4B:
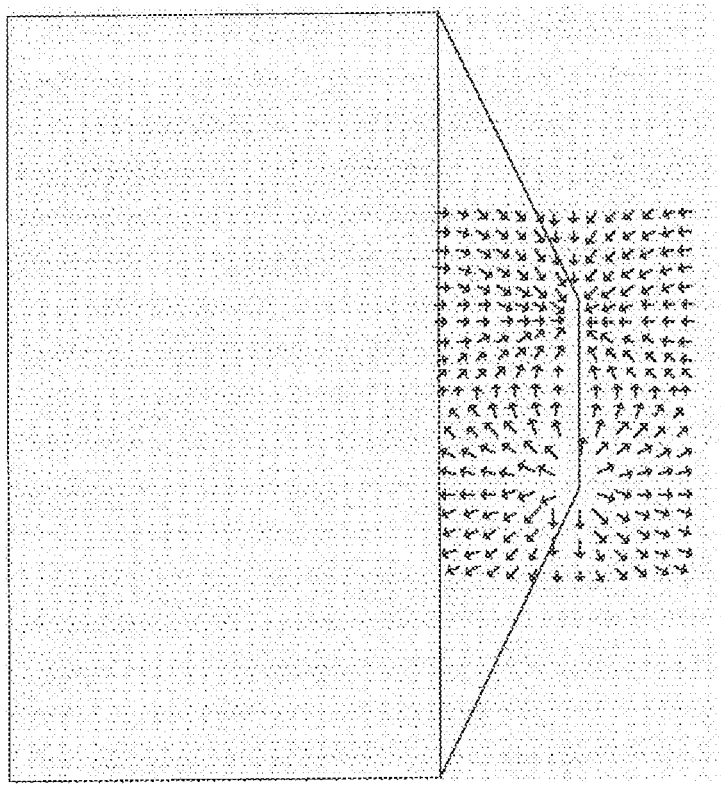
FIG. 4B is a plot of a simulated electric field, according to aspects of the disclosure.
Figure 4A:
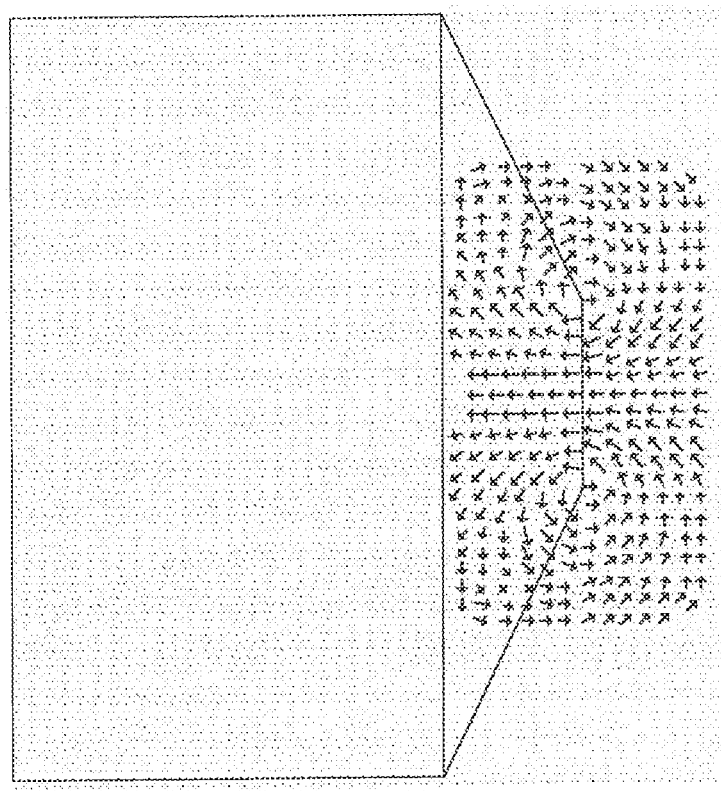
FIG. 4A is a plot of a simulated magnetic field, according to aspects of the disclosure.

FIGS. 4A is a plot of a simulation of the magnetic field produced by the loop 22 of the microscope objective 10. FIG. 4B is a plot of a simulation of the electric field produced by the loop 22 of the microscope objective 10. It should be appreciated that the embodiment of the microscope objective 10, which is simulated in the FIGS. 4A-B, includes a notch that is formed in the lens holder 24 of the microscope objective 10 and/or the housing 16 of the microscope objective 10.

FIG. 5 shows the microscope objective 10, in accordance with yet another implementation. In the example of FIG. 5, the housing 16 is formed of aluminum, and a dielectric circuit board 50 is disposed on a surface of the housing 16 and/or the lens holder 24. The conductors 18*a* and 18*b* are implemented as conductive traces, and they are disposed on a surface of the circuit hoard 50. First ends of the traces (not visible in FIG. 5) can be coupled to an RF input/output port (such as an RF connector, for example). Second ends of the traces may form the loop 22 around the perimeter of the lens 23, as shown. In the example of FIG. 5, the notch 25 is provided in the circuit board 50 and housing 16. Furthermore, in the example of FIG. 5, the circuit board 50 is formed of a substrate, such as FR4. However, alternative implementations are possible in which any other suitable type of material is used.

Figure 7:
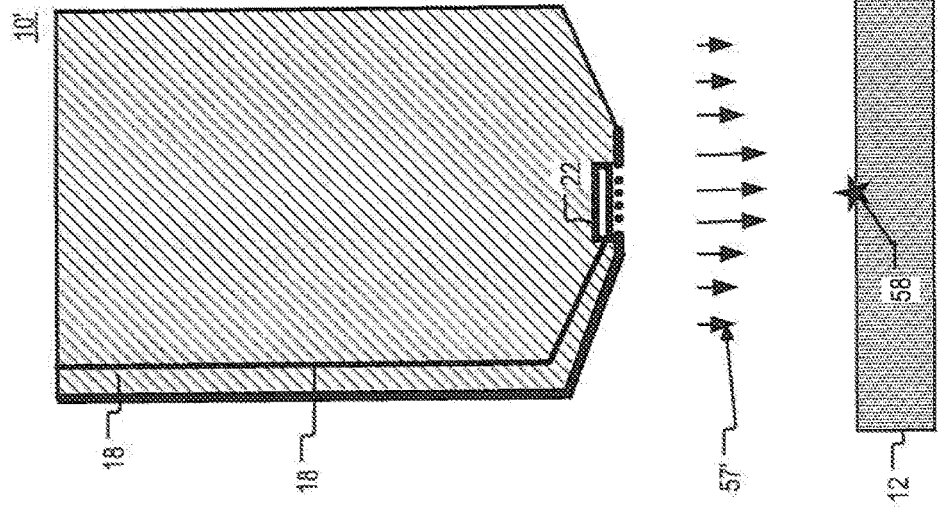
FIG. 7 is a side view of a microscope objective that is not provided with a notch, according to aspects of the disclosure.
Figure 6:
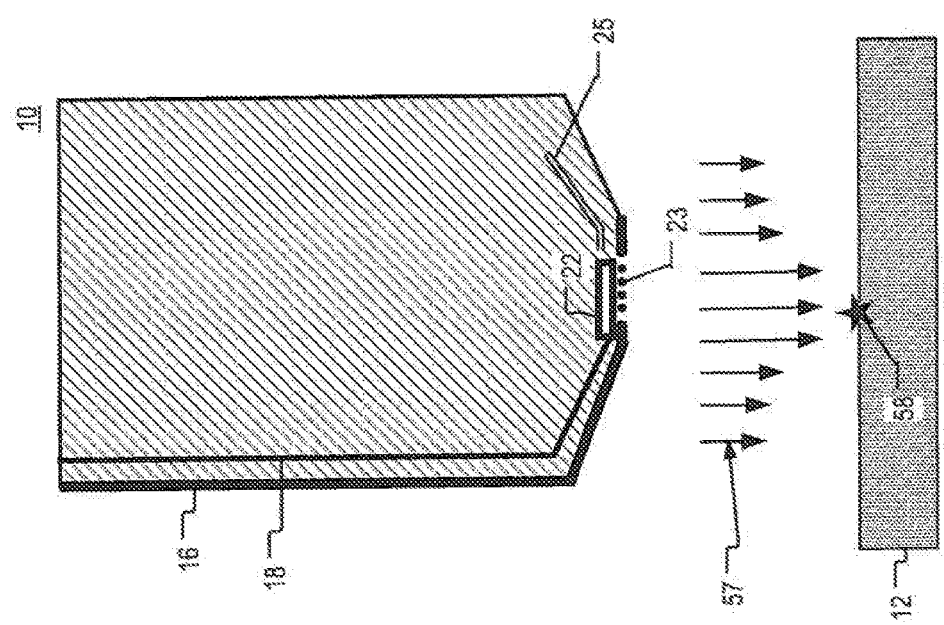
FIG. 6 is a side view of a microscope objective that is provided with a notch, according to aspects of the disclosure.

FIG. 6 shows a schematic cross-sectional side view of the microscope objective 10. FIG. 7 shows a schematic cross-sectional side view of the microscope objective 10'. The microscope objective 10' may be the same or similar to the microscope objective 10. However, unlike the microscope objective 10, the microscope objective 10' lacks a notch 25. The microscope objective 10 is configured to produce a magnetic field having a z-axis component 57. The microscope objective 10' is configured to produce a magnetic field having a z-axis component 57'. According to the example of FIG. 6, at least a portion of the notch 25 is formed in the housing 16.

Figure 8:
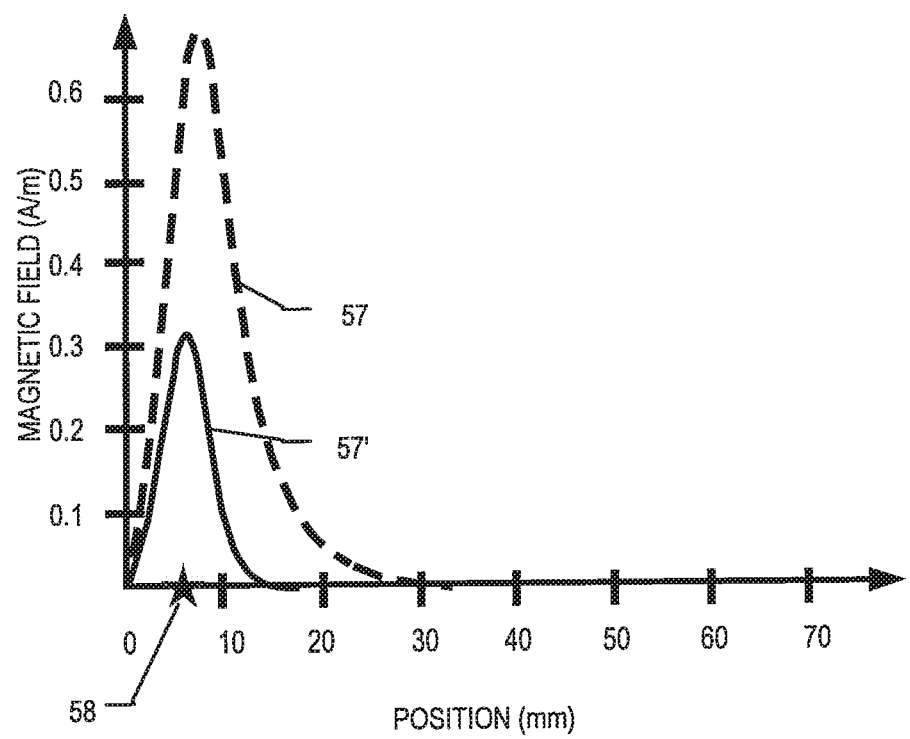
FIG. 8 is a plot comparing the magnetic fields produced by the microscope objectives of FIGS. 6 and 7, according to aspects of the disclosure.

FIG. 8 is a plot comparing the strength of the z-axis components 57 and 57' of the magnetic fields produced by microscope objectives 10 and 10', respectively. As illustrated, the microscope objective 10 may produce a magnetic field whose z-axis component at location 58 in the sample holder 12 (i.e., directly beneath the lens 23) is over twice as large as the z-axis component of the magnetic field produced by the microscope objective 10'. As noted above, the increase in the strength of the z-axis component of the magnetic field produced by the microscope objective 10 is attributable to the notch 25 disrupting the flow of current in the lens holder 24.

Figure 9B:
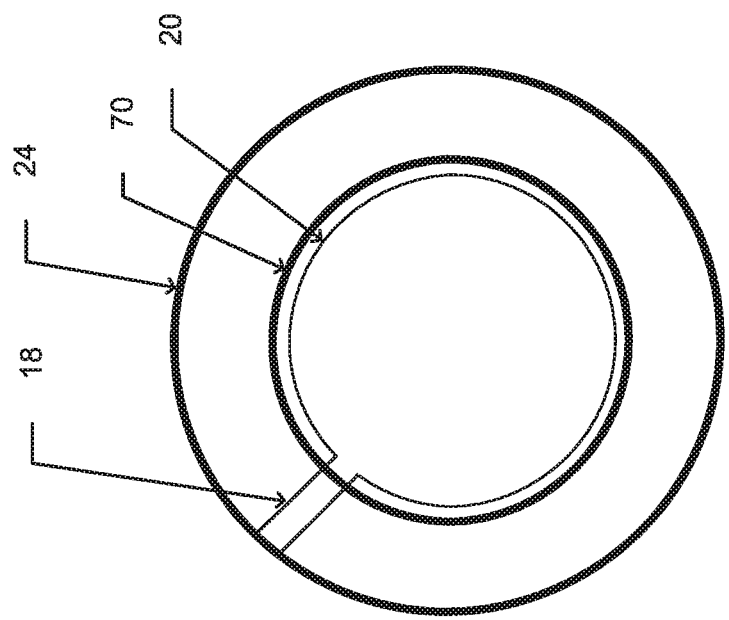
FIG. 9B is a bottom view of a microscope objective, according to aspects of the disclosure.
Figure 9A:
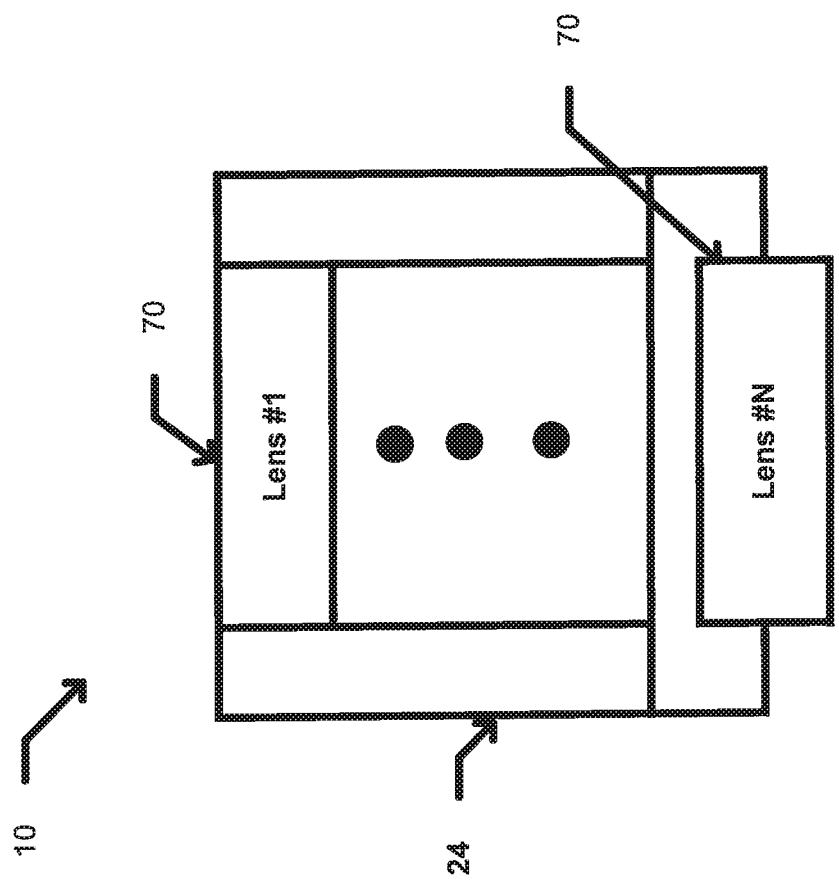
FIG. 9A is a side view of a microscope objective, according to aspects of the disclosure.

FIGS. 9A and 9B show the microscope objective 10, in accordance with yet another implementation. In the example of FIG. 9A, the microscope objective 10 includes a lens system 70, which is disposed in or otherwise secured by the lens holder 24. The lens holder 24 holds in place or otherwise secures the front of the lens system 70 and may also couple the front lens system to other portions of the microscope objective 10. The lens system 70 may itself comprise one or more lenses. As illustrated in FIG. 9B, the loop 22 may include multiple turns, here three (3) turns. By utilizing a loop having a plurality of turns, the applied magnetic field is magnified by approximately the number of turns (e.g., the magnetic field is magnified by approximately three (3) in this example).

In the example of FIGS. 1A and 2A, the lens holder 24 is depicted as being separate from the housing 16. However, alternative implementations are possible in which the lens holder 24 is integral with the housing 16. In this regard, it will be understood that the term "lens holder of a microscope objective," as used through the disclosure may refer to either a component that is used to hold a lens (e.g., lens 23) in place, or a portion of the housing of the microscope objective where the lens is disposed. Reference herein to "one embodiment" or "an embodiment" means that a particular feature, structure, or characteristic described in connection with the embodiment can be included in at least one embodiment of the claimed subject matter. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing and claiming the invention and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It will be further understood that various changes in the details, materials, and arrangements of the parts which have been described and illustrated in order to explain the nature of the claimed invention might be made by those skilled in the art without departing from the scope of the following claims.

What is claimed is:

1. A microscope objective comprising:
   a lens;
   a housing;
   a lens holder coupled to one end of the housing and extending away from the housing, the lens holder being arranged to hold the lens and couple the lens to the housing;
   a first conductor and a second conductor, the first conductor and the second conductor extending along a sidewall of the housing, the first conductor and the second conductor being arranged to form at least one loop that is disposed about at least a portion of a perimeter of a field of view of the lens,
   wherein the lens holder includes one or more notches that are formed thereon.

2. The microscope objective of claim 1, wherein the loop is formed on the lens holder, and the loop encloses the field of view of the lens.

3. The microscope objective of claim 1, wherein the loop is formed over the lens.

4. The microscope objective of claim 1, wherein the first conductor and the second conductor from a microstrip.

5. The microscope objective of claim 1, further comprising a dielectric circuit board that is formed on the housing, wherein the first conductor and the second conductor are formed on the dieletric circuit board.

6. The microscope objective of claim 1, wherein the loop is disposed around a perimeter of the lens.

7. The microscope objective of claim 1, wherein at least a portion of the loop is disposed above or below a mid-portion of the lens.

8. A microscope objective comprising:
   a lens;
   a housing;
   a removable clip that is coupled to the housing;
   a lens holder that is arranged to couple the lens to the housing; and
   a first conductor and a second conductor, the first conductor and the second conductor extending along a sidewall of the housing, the first conductor and the second conductor being arranged to form at least one loop that is disposed about at least a portion of a perimeter of a field of view of the lens,
   wherein the loop is disposed on the removable clip.

9. A microscope objective comprising:
   a lens;
   a housing;
   a lens holder that is arranged to couple the lens to the housing;
   a first conductor and a second conductor, the first conductor and the second conductor extending along a sidewall of the housing, the first conductor and the second conductor being arranged to form at least one loop that is disposed about at least a portion of a perimeter of a field of view of the lens; and
   a radio-frequency (RF) connector disposed on the housing, the RF connector being electrically coupled to the first conductor and the second conductor.

10. A microscope objective having an optical path, the microscope objective comprising:
    a housing having a radio-frequency (RF) connector disposed thereon;
    a lens holder that is coupled to the housing;
    a first conductor and a second conductor that are electrically coupled to the RF connector, the first conductor and the second conductor extending along a sidewall of the housing and onto the lens holder, the first conductor and the second conductor being arranged to form at least one loop onto a surface of the lens holder, the at least one loop being disposed on the optical path of the housing.

11. The microscope objective of claim 10, wherein the lens holder includes one or more notches that are formed in a surface of the lens holder.

12. The microscope objective of claim 10, further comprising a dielectric circuit board that is disposed on a sidewall of the housing, wherein the first conductor and the second conductor are formed on the dielectric circuit board.

13. The microscope objective of claim 10, wherein the loop is disposed around a perimeter of the lens.

14. The microscope objective of claim 10, wherein at least a portion of the loop is disposed above or below a mid-portion of the lens.

15. A microscope objective having an optical path, the microscope objective comprising:
- a housing;
- a radio-frequency (RF) connector;
- a lens holder that is coupled to the housing, the lens holder having a main surface extending across the optical path, the main surface having one or more notches formed thereon;
- a first conductor and a second conductor that are coupled to a sidewall of the housing, the first conductor and the second conductor being arranged to form a loop,
- wherein: (i) the first conductor and the second conductor are electrically coupled to the RF connector, and (ii) the first conductor and the second conductor extend along the sidewall of the housing and onto the lens holder.

16. The microscope objective of claim 15, further composing a dielectric circuit board that is disposed on a sidewall of the housing, wherein the first conductor and the second conductor are formed on the dielectric circuit board.

17. The microscope objective of claim 15, wherein the loop is disposed around a perimeter of the lens.

18. The microscope objective of claim 15, wherein at least a portion of the loop is disposed above or below a mid-portion of the lens.

\* \* \* \* \*